United States Patent
Ishida et al.

(10) Patent No.: US 7,268,069 B2
(45) Date of Patent: Sep. 11, 2007

(54) METHOD OF FABRICATING SEMICONDUCTOR DEVICE HAVING MULTILAYER WIRING STRUCTURE

(75) Inventors: Katsuhiro Ishida, Yokkaichi (JP);
Hiroshi Sugiura, Yokkaichi (JP);
Makoto Hasegawa, Yokkaichi (JP);
Katsuya Ito, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 259 days.

(21) Appl. No.: 10/988,613

(22) Filed: Nov. 16, 2004

(65) Prior Publication Data
US 2005/0167843 A1    Aug. 4, 2005

(30) Foreign Application Priority Data
Nov. 17, 2003    (JP) .............................. 2003-386526

(51) Int. Cl.
*H01L 21/4763* (2006.01)
(52) U.S. Cl. ...................... 438/629; 438/108; 438/639; 438/672; 257/774; 257/779
(58) Field of Classification Search ................ 438/108, 438/629, 638, 639, 640, 672, 675; 257/774, 257/779
See application file for complete search history.

(56) References Cited

U.S. PATENT DOCUMENTS

| | | | |
|---|---|---|---|
| 6,191,027 B1 * | 2/2001 | Omura | 438/627 |
| 6,271,596 B1 * | 8/2001 | Alers | 257/774 |
| 6,291,891 B1 * | 9/2001 | Higashi et al. | 257/774 |
| 6,448,649 B1 * | 9/2002 | Lee et al. | 257/758 |
| 2001/0038147 A1 * | 11/2001 | Higashi et al. | 257/750 |
| 2004/0009653 A1 * | 1/2004 | Ueda et al. | 438/622 |
| 2004/0166668 A1 * | 8/2004 | Ito | 438/637 |
| 2004/0188842 A1 * | 9/2004 | Takewaka et al. | 257/758 |
| 2005/0287803 A1 * | 12/2005 | Lee | 438/672 |

FOREIGN PATENT DOCUMENTS

| | | |
|---|---|---|
| JP | 2000-208615 | 7/2000 |
| JP | 2002-176098 | 6/2002 |

* cited by examiner

*Primary Examiner*—Fernando L. Toledo
(74) *Attorney, Agent, or Firm*—Oblon, Spivak, McClelland, Maier & Neustadt, P.C.

(57) ABSTRACT

A method of fabricating a semiconductor device includes forming a lower wiring layer on a semiconductor substrate, forming an interlayer insulating film on the lower wiring layer, layer, forming a plurality of. contact plugs in the interlayer insulating film so that the contact plugs are brought into electrical contact with the lower wiring layer, thereby forming an interlayer wiring layer, forming an upper wiring, layer on the interlayer wiring layer so that the upper wiring layer is brought into electrical contact with the contact plugs, and patterning the upper wiring layer so that the upper wiring layer corresponds to the contact plugs. In the patterning, after the upper wiring layer has been etched, the exposed interlayer insulating film and the exposed contact plugs are etched.

2 Claims, 11 Drawing Sheets

METHOD OF FABRICATING SEMICONDUCTOR DEVICE HAVING MULTILAYER WIRING STRUCTURE

CROSS-REFERENCE TO RELATED APPLICATION

This application claims priority to Japanese patent application No. 2003-386526, the content of which is incorporated herein by reference.

BACKGROUND OF THE INVENTION

1. Field of the Invention

The present invention relates to a semiconductor device having a multilayer wiring structure and a method of fabricating the same.

2. Description of the Related Art

Semiconductor devices have been making progress in high integration year by year, and a reduction in the rules of circuit design has been introduced as the requirement for miniaturization. The reduction in the circuit design rules is directly related to a reduction in a circuit area. For example, in an integrated circuit having a multilayer wiring structure, a distance between adjacently formed via holes is reduced such that a distance between each via hole and metal wiring formed in an upper layer is also reduced at the same time.

Such a reduction in the distance between each via hole and the metal wiring further reduces a positioning margin in a lithography process, which renders the processing technique difficult. In addition, since a distance between adjacent wiring patterns is reduced, it becomes difficult to obtain a desired insulating property. When a sufficient distance of insulation is not obtained, there arises a problem of failure due to short circuit such as dielectric breakdown or direct short circuit or a problem of parasitic capacitance, resulting in a difficulty in achieving a stable device operation.

FIGS. 10A to 11B illustrate an example of the foregoing circumstances. FIG. 10A shows an example of multilayer wiring structure having no occurrence of patterning misalignment, whereas FIG. 10B shows an example of multilayer wiring structure in which misalignment has resulted from the patterning. As shown in these figures, an Al—Cu layer 2 serving as a lower wiring layer is formed on a silicon substrate 1. A titanium nitride (TiN) layer 3 serving as a barrier metal is formed on the Al—Cu layer 2. An interlayer wiring layer 4 is formed on the TiN layer 3. The interlayer wiring layer 4 has via holes each formed so as to extend vertically through a predetermined part of a dual tetraethyl orthosilane (d-TEOS) film 5. Contact plugs 6a and 6b made from tungsten (W) or the like are formed in the via holes respectively.

Barrier metal layers 7a and 7b each serving as an upper wiring layer, Al—Cu layers 8a and 8b and barrier metal layers 9a and 9b are patterned on the top of the interlayer wiring layer 4 so as to correspond to the locations of the contact plugs 6a and 6b. A distance d0 between electrodes in the upper wiring layer is, for example, 80 nm. In the case of FIG. 10B, there is an amount of misalignment A in the patterning of the upper wiring layer.

FIGS. 11A and 11B are sectional views corresponding to parts of the fabrication process respectively. As shown in FIG. 11A, the Al—Cu layer 2 and TiN film 3 of the lower wiring layer are formed, and the d-TEOS film 5 with a film thickness of 500 nm is formed on the TIN film 3. Tungsten as a material for the contact plugs 6a and 6b is buried in the via holes respectively.

In the state as shown in FIG. 11A, the TiN film 7, the Al—Cu film 8 of the upper wiring layer material and the TiN film 9 are formed on the d-TEOS film 5 serving as an interlayer insulating film, and resists 10a and 10b corresponding to a wiring circuit are patterned as shown in FIG. 11B. Misalignment occurs during a lithography process and an amount of misalignment A is, for example, 50 nm.

The TiN film 9, Al—Cu film 8 and TiN film 7 are etched by a reactive ion etching (RIE) process using a gas plasma such that the structure as shown in FIG. 10B is obtained. In this case, the TiN films 9a and 9b, Al—Cu films 8a and 8b, and TiN films 7a and 7b are electrically connected to the tungsten plugs 6a and 6b while misalignment has occurred by the misalignment amount A.

When the misalignment amount A is, for example, 30 nm as the result of occurrence of the foregoing misalignment, an insulation distance d1 between the upper wiring layer of the TiN film 9a, Al—Cu film 8a and TiN film 7a and the adjacent tungsten 6b becomes 50 nm. As a result, since a sufficient insulation distance can be ensured, no problem arises in the operation of the device. However, the insulation distance d1 becomes 30 nm when the misalignment amount A is increased to 50 nm. Consequently, there is a possibility of occurrence of a short circuit or an increase in the parasitic capacitance.

As one of conventional countermeasures, the specification of positioning in the lithography process has been reconsidered and/or the diameters of the via holes have been reduced. However, the reduction in the circuit design rules makes it difficult to obtain an insulation distance and at the same time, it is quite difficult to carry out further reconsideration of the positioning specification in view of the device performance. Further, variations in the diameter of the via hole also make it difficult to obtain a stable distance between insulators. Still further, at the same time, even when the diameter of the via hole is reduced, such reduction directly results in reduction in a junction area. As a result, a desired operation of the device cannot be achieved. Thus, the foregoing problem needs to be overcome for future fabrication of semiconductor circuits.

Accordingly, securement of the insulation distance and prevention of failure due to short circuit or parasitic capacitance are particularly important in the fabrication of multilayer wiring circuits in order that a stable device operation may be obtained against miniaturization of the device. JP-A-2000-208615 and JP-A-2002-176098 disclose the foregoing countermeasures.

JP-A-2000-208615 discloses an interlayer connection structure connecting upper and lower wiring layers of a semiconductor substrate. In this case, even upon occurrence of misalignment during the lithography process, a sufficient distance of electrical insulation can be ensured between contact portions adjacent to each other, whereby a sufficient contact area can be secured.

Further, JP-A-2002-176098 discloses a semiconductor device employing a structure that a lower side contact plug is previously recessed in the formation of a multilayer wiring circuit of a borderless structure so that a contact pattern at an upper wiring layer is prevented from reaching a contact plug due to misalignment, thereby preventing short circuit.

In each of the foregoing references, however, a width of a gap differs according to an amount of misalignment at the occasion of an etching process for recessing the contact plug, resulting in a problem of burying performance in the case where an interlayer insulating film is buried in an upper layer.

BRIEF SUMMARY OF THE INVENTION

Therefore, an object of the present invention is to provide a semiconductor device in which a sufficient insulation distance can be ensured between the upper wiring layer and the adjacent contact plug in consideration of occurrence of misalignment in the lithography process, and a stable electric characteristic can be achieved and yet, a stable process can be provided so that embeddability the burying performance of the interlayer insulating film stacked on the upper layer can be prevented from being reduced, and a method of fabricating the semiconductor device.

The invention provides a method of fabricating a semiconductor device, comprising forming a lower wiring layer on a semiconductor substrate, forming an interlayer insulating film on the lower wiring layer, forming a plurality of contact plugs in the interlayer insulating film so that the contact plugs are brought into electrical contact with the lower wiring layer, thereby forming an interlayer wiring layer, forming an upper wiring layer on the interlayer wiring layer so that the upper wiring layer is brought into electrical contact with the contact plugs, and patterning the upper wiring layer so that the upper wiring layer corresponds to the contact plugs, wherein in the patterning, after the upper wiring layer has been etched, an exposed interlayer insulating film and exposed contact plugs are etched.

BRIEF DESCRIPTION OF THE DRAWINGS

Other objects, features and advantages of the present invention will become clear upon reviewing the following description of the embodiments with reference to the accompanying drawings, in which.

DETAILED DESCRIPTION OF THE INVENTION

Several embodiments of the present invention will be described with reference to the accompanying drawings. FIGS. 1A to 3 illustrate a first embodiment of the invention. Each figure shows a typical section of a part of the multilayer wiring structure. Dimensions do not sometimes agree to the actual dimensions for the sake of easiness in explanation.

Figure 1A:
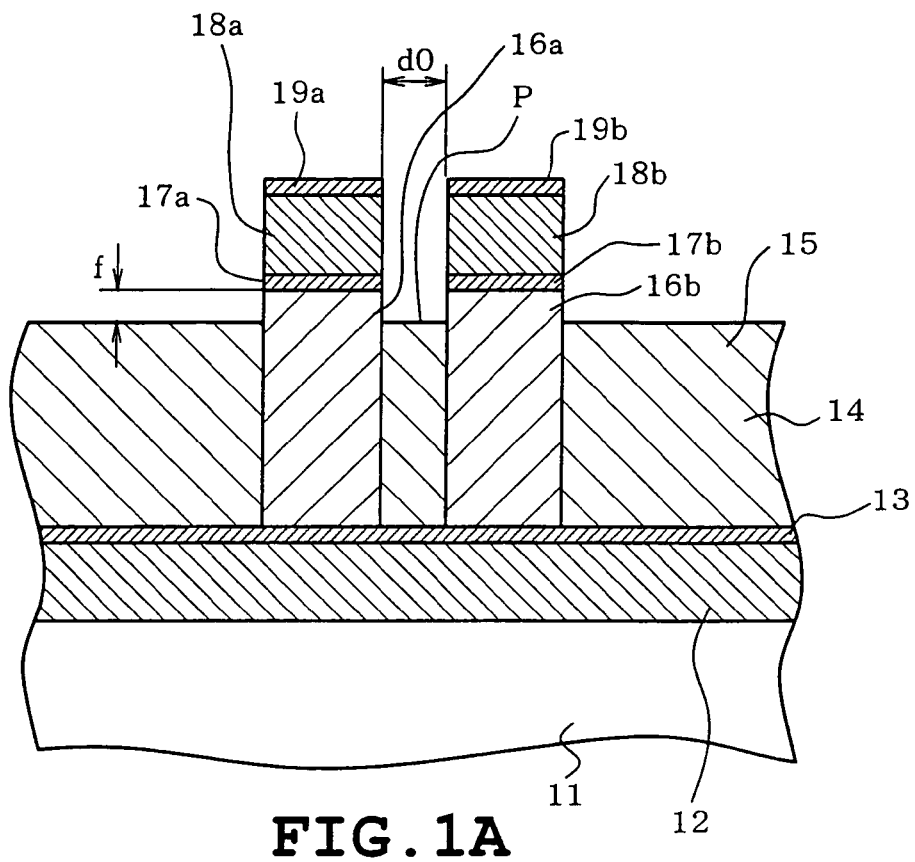
FIGS. 1A and 1B are typical longitudinal sections of the semiconductor device in accordance with a first embodiment of the present invention, showing a case where no misalignment has occurred and another case where misalignment has occurred respectively.
Figure 1B:
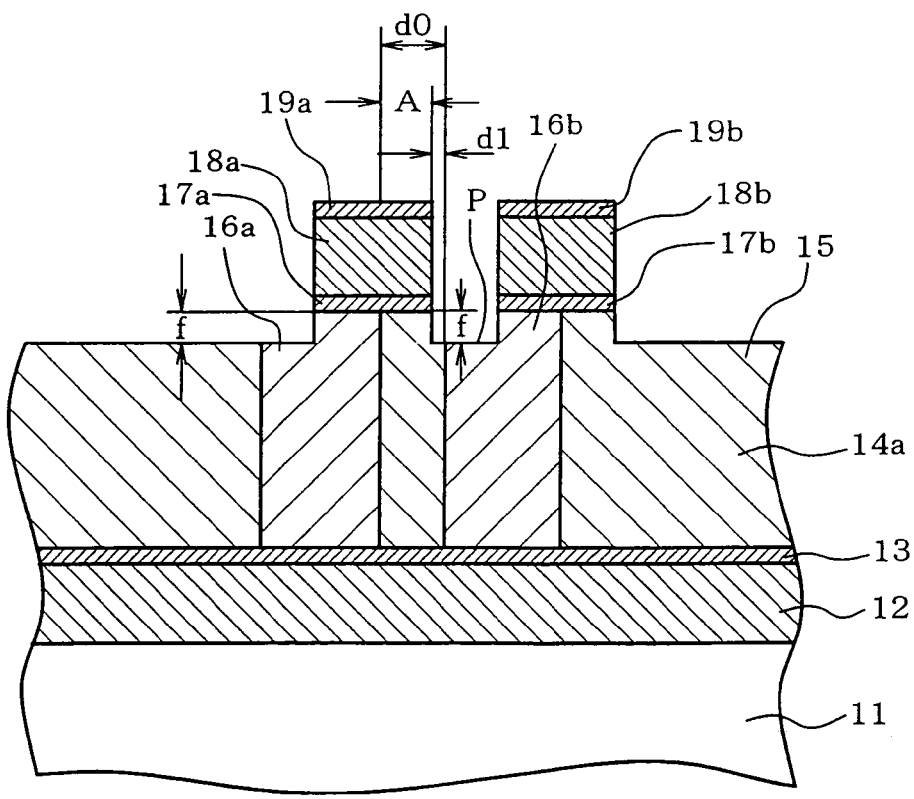

FIGS. 1A and 1B show one layer of the multilayer wiring structure in the first embodiment. FIG. 1A shows a case where no misalignment has occurred during the patterning. FIG. 1B shows a case where misalignment has occurred. Firstly, referring to FIG. 1A, a silicon substrate 11 serving as a semiconductor substrate is formed with an Al—Cu layer 12 serving as a lower wiring layer. A TiN film 13 serving as a barrier metal layer is formed on the Al—Cu layer 12. An interlayer wiring layer 14 is formed on the TiN film 13. The interlayer wiring layer 14 has a plurality of via holes each vertically formed through predetermined portions of a d-TEOS film 15. Tungsten plugs 16a and 16b serving as contact plugs are embedded in the via holes respectively.

The tungsten plugs 16a and 16b are formed so as to protrude from the surfaces of the d-TEOS films 15 in the aforementioned construction. Although the d-TEOS film 15 is formed at the same level as the surfaces of the tungsten plugs 16a and 16b, the plugs protrude relative to the surfaces of the d-TEOS films 15 when a recessed portion P has been formed.

On the interlayer wiring layer 14 are patterned TiN films 17a and 17b of barrier metal serving as an upper wiring layer, Al—Cu films 18a and 18b of the wiring layer, and TiN films 19a and 19b of the barrier metal. Subsequently, when a wiring layer is further formed as an upper layer, insulating films are formed on the upper surfaces of the TiN films 19a and 19b and thereafter, a multilayer wiring structure can be formed in the same manner as described above. In this state, upper layer side electrodes are separated by distance d0. Since no misalignment has occurred in the patterning during formation of the upper wiring layer in the aforementioned case, the portions of the tungsten plugs 16a and 16b protrude.

On the other hand, the following is a case where misalignment has occurred: that is, in FIG. 1B, misalignment of a mask pattern amounting to distance A has occurred in the lithography process after stack of a TiN film 17, an Al—Cu film 18 and a TiN film 19 all serving as an upper wiring layer. In this configuration, as the result of occurrence of misalignment, an interlayer wiring layer 14 is formed while the tungsten plugs 16a and 16b and d-TEOS film 15 are etched to be recessed. In this case, a pattern of the TiN film 17a, Al—Cu film 18a and TiN film 19a of the left side upper wiring layer is located in the vicinity of the right side tungsten plug 16b and a distance d1 is defined between the pattern and tungsten plug as viewed in FIG. 1B.

Even in the above-described case, a recessed portion P is formed such that there is a vertical difference of a predetermined distance between the underside of the TiN film 17a and the upper face of the adjacent contact plug 16b. Accordingly, the distance d1 is not defined between the tungsten plug 16b and the Al—Cu film 17a of the upper wiring layer but a distance in a straight line corresponding to a depth f of the recessed portion P can be ensured as a distance of insulation. Consequently, for example, even when a horizontal misalignment distance d1 is almost 0, the insulation distance not less than a predetermined amount can be ensured since the recessing dimension f of the recessed portion P is ensured.

Figure 2A:
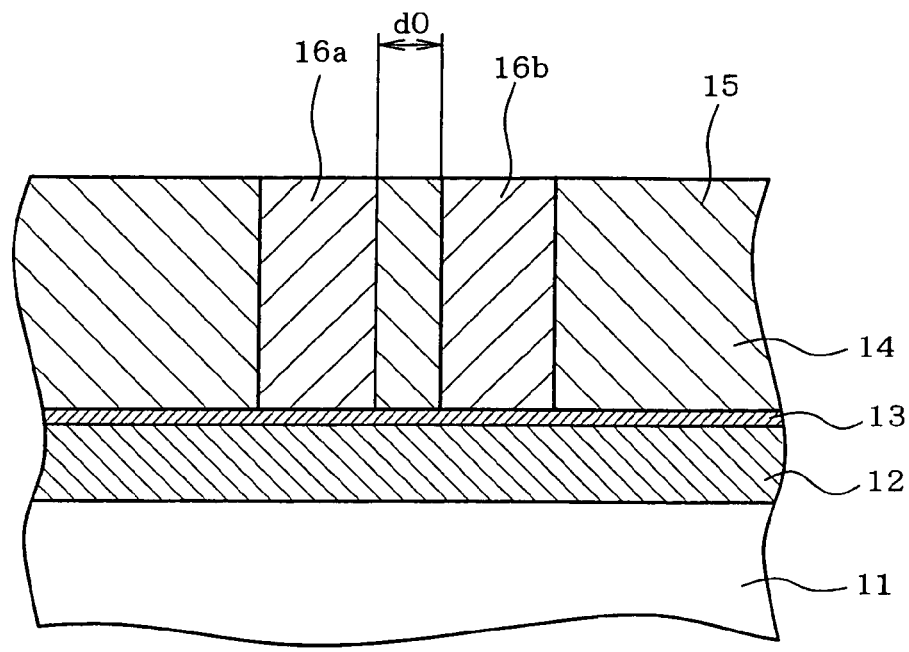
FIGS. 2A and 2B are typical longitudinal sections of the semiconductor device at different stages of the fabrication process in the case where no misalignment has occurred.
Figure 2B:
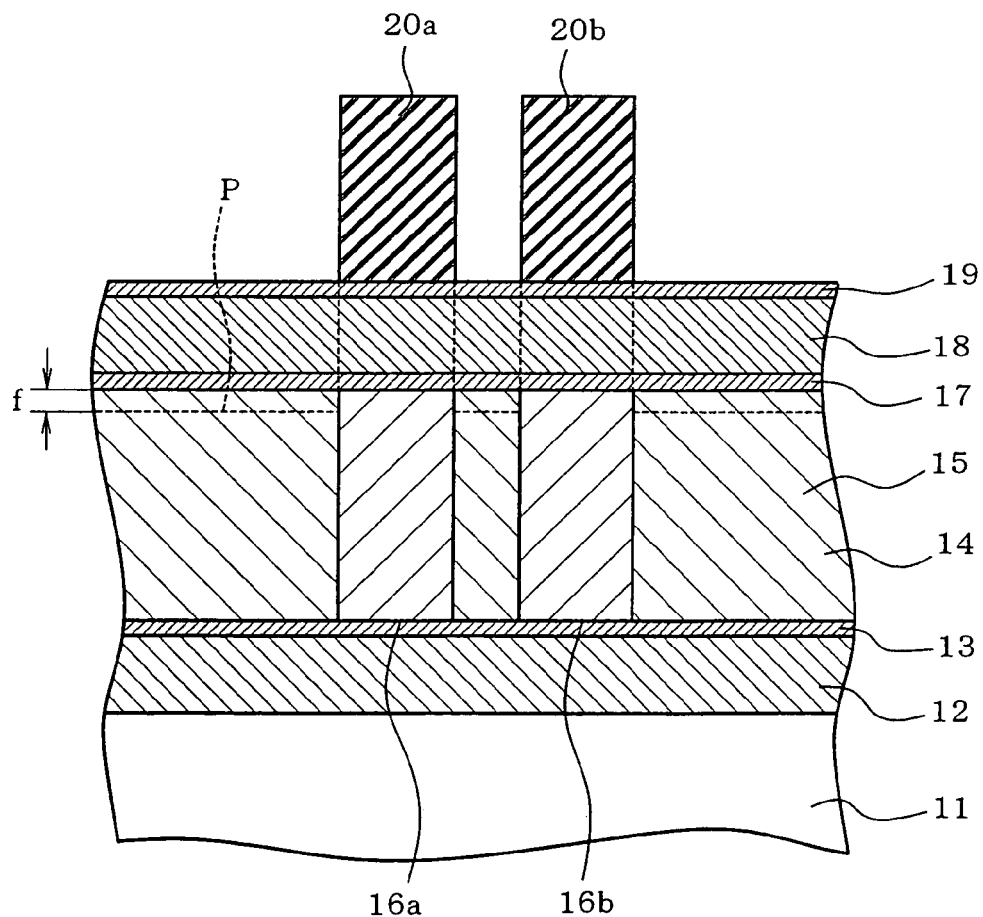
Figure 3:
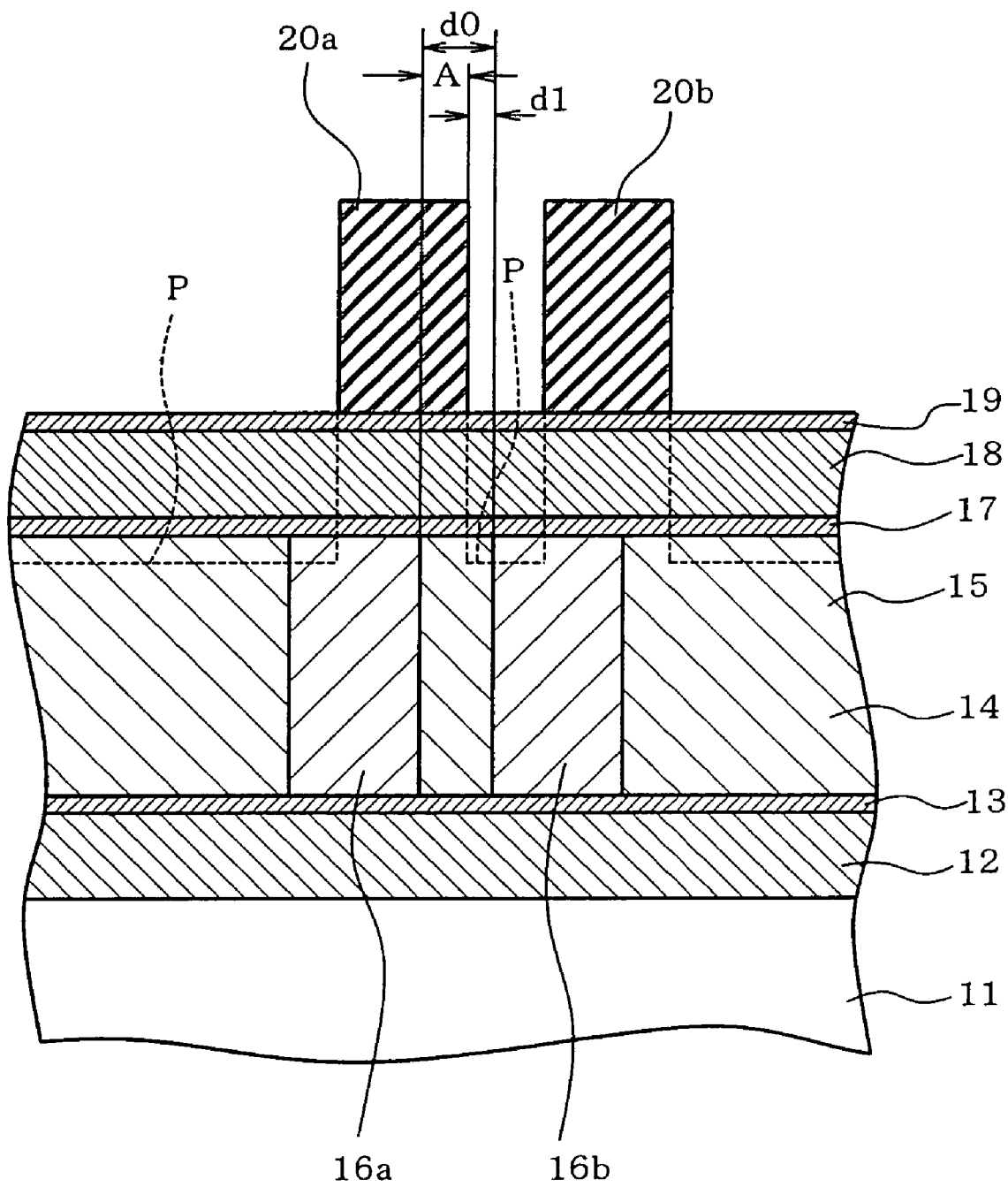
FIG. 3 is a view similar to FIG. 2B, showing the case where misalignment has occurred.

A fabricating process of the foregoing structure will be described with reference to FIGS. 2A to 3. FIGS. 2A to 3 are sectional views corresponding to steps of the fabricating process respectively. FIGS. 2A and 2B show the case where no misalignment has occurred. As shown in FIG. 2A, the d-TEOS film 15 having a film thickness of 500 nm, for example, and serving as the interlayer insulating film is formed on the Al—Cu film 12 of the lower wiring layer and the TiN film 13 serving as the material for the barrier metal layer. Further, a via-hole pattern in which each via hole has a diameter of 150 nm, for example is formed in the interlayer insulating film by a reactive ion etching (RIB). Subsequently, the tungsten plugs 16a and 16 serving as contact plugs are buried in the via holes by the film-forming technique of the sputtering process respectively. In this case, films are formed on the tungsten plugs 16a and 16b buried in the via holes by the sputtering and thereafter, a planarization process is carried out for the tungsten plugs as well as for the surface of the d-TEOS film 15. Reference symbol d0 in FIG. 2A designates a distance between the via holes adjacent to each other. In this case, the distance d0 is 80 nm.

FIG. 2B shows the TiN film 17 serving as the barrier metal, the Al—Cu film 18 serving as the upper layer wiring material and the TiN film 19 serving as the barrier metal. The TiN film 17 is formed on the d-TEOS film 15 serving as the interlayer insulating film in the state as shown in FIG. 2A. The Al—Cu film 18 is formed on the TiN film 17. Resists 20a and 20b are formed on the TiN film 19 by the lithography process into the pattern of a wiring circuit. Each resist has a width of 150 nm. Subsequently, an etching process is carried out so that the upper layer wiring layer is formed. The resists 20a and 20b are used as a mask for the etching. The TiN film 19, Al—Cu film 18 serving as the upper layer wiring material and TiN film 17 serving as the barrier metal are etched by RIE process using a gas plasma comprising BCl$_3$/Cl (the flow rate is set as BCl$_3$/Cl=50/50 sccm, for example).

Successively, the etching process is further carried out to form the recessed portion P of the interlayer wiring layer 14. Regarding the etching condition, a gas plasma comprising CF$_4$/Ar (the flow rate is set to 30/50 sccm, for example) is used so that the case where the W plugs 16a and 16b are exposed can be coped with. Consequently, both W plugs 16a and 16b and d-TEOS film 15 serving as the interlayer insulating film can simultaneously be etched. Further, an amount of etching is determined so that the undersides of the TiN films 17a and 17b are downwardly recessed by a depth f. As a result, the recessed portion P is formed. Subsequently, the resists 20a and 20b are eliminated by an ashing process such that the semiconductor device as shown in FIG. 1A is obtained.

On the other hand, when misalignment occurs in the semiconductor device of FIG. 2B on which the resists 20a and 20b have been patterned, FIG. 3 shows the semiconductor device under the aforesaid condition. In this case, when the TiN film 19, Al—Cu film 18 and TiN film 17 each serving as an upper wiring layer are etched, the W plugs 16a and 16b are exposed at the surface of the interlayer wiring layer 14. Accordingly, in a case where the interlayer wiring layer 14 is subsequently etched so as to be recessed, both W plugs 16a and 16b and d-TEOS film 15 are etched when the aforesaid etching condition is used. In this case, the TiN films 19a and 19b, Al—Cu films 18a and 18b, and TiN films 17a and 17b are affected by a misalignment amount A caused by the lithography process. As a result, these films are joined to the W plugs 16a and 16b formed in the via holes respectively under the occurrence of misalignment.

However, an insulation distance can be ensured since the following represents a distance between the upper wiring layer of TiN film 19a, Al—Cu film 18a and TiN film 17a and the W plug 16b formed in the via hole adjacent to the wiring layer. That is, reference symbol d0 designates a clearance in the case of occurrence of no misalignment. When a misalignment amount A has occurred, a two-dimensional clearance d1 is obtained by subtracting the misalignment amount A from the aforesaid clearance d0, and additionally, the upper wiring layer is further spaced away from the W plug 16b by the misalignment amount f in the direction of the depth. Accordingly, for example, when the misalignment amount f is 20 nm, a clearance along the side is obtained by the sum of them (=d1+f). A distance in a straight line is obtained as a value of a square root of sum of square of d1 and f (the Pythagorean proposition).

Consequently, a desired insulation distance is ensured and a stable device operation can be obtained. Accordingly, for example, when the recess amount f is set as a necessary insulation distance, the insulation distance can be ensured only by the recess amount f even if a misalignment amount A should become a maximum value of d0.

In the foregoing embodiment, when the upper wiring layer is patterned, the interlayer insulation layer 14 is also etched so as to be recessed, following the etching process for the TiN film 19, Al—Cu film 18 and TiN film 17. Consequently, even when a necessary horizontal insulation distance d0 is not ensured, the recess amount f in the direction of the depth can be added to as the result of formation of the recessed portion P. As a result, even when a necessary margin cannot be obtained due to a misalignment amount in the lithography process or miniaturization in the circuit design rules, occurrence of a short circuit and an increase in the parasitic capacitance can be prevented. Moreover, an increase in the costs can be restrained since this can be achieved only by addition of the etching process without an increase in the number of times of lithography.

Figure 4A:
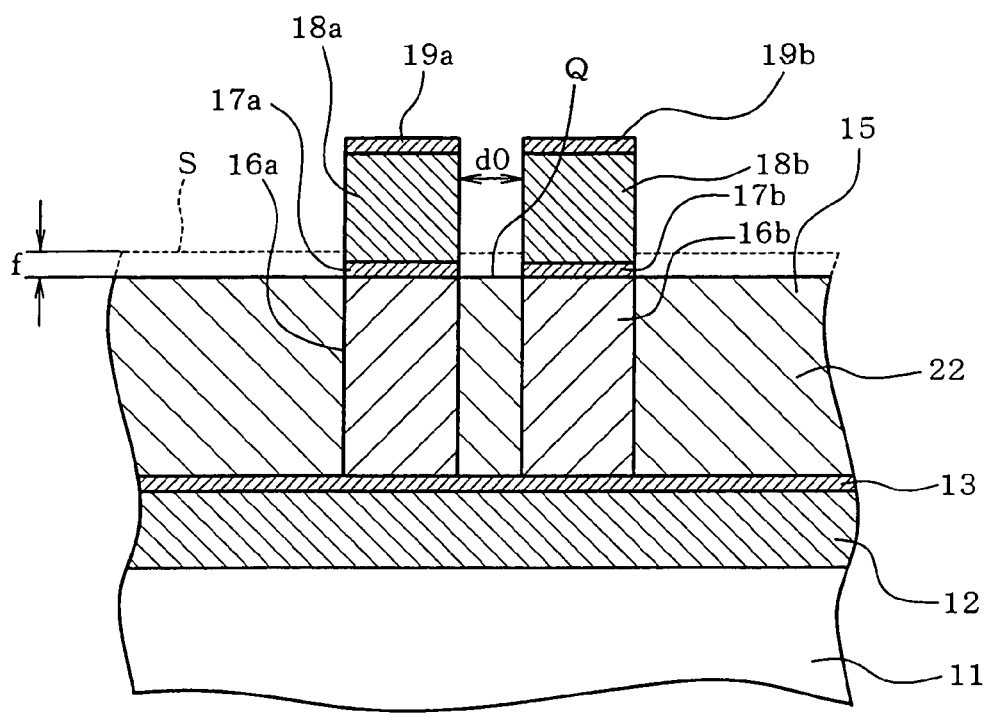
FIGS. 4A and 4B are views similar to FIGS. 1A and 1B, showing the semiconductor device in accordance with a second embodiment, respectively.
Figure 10A:
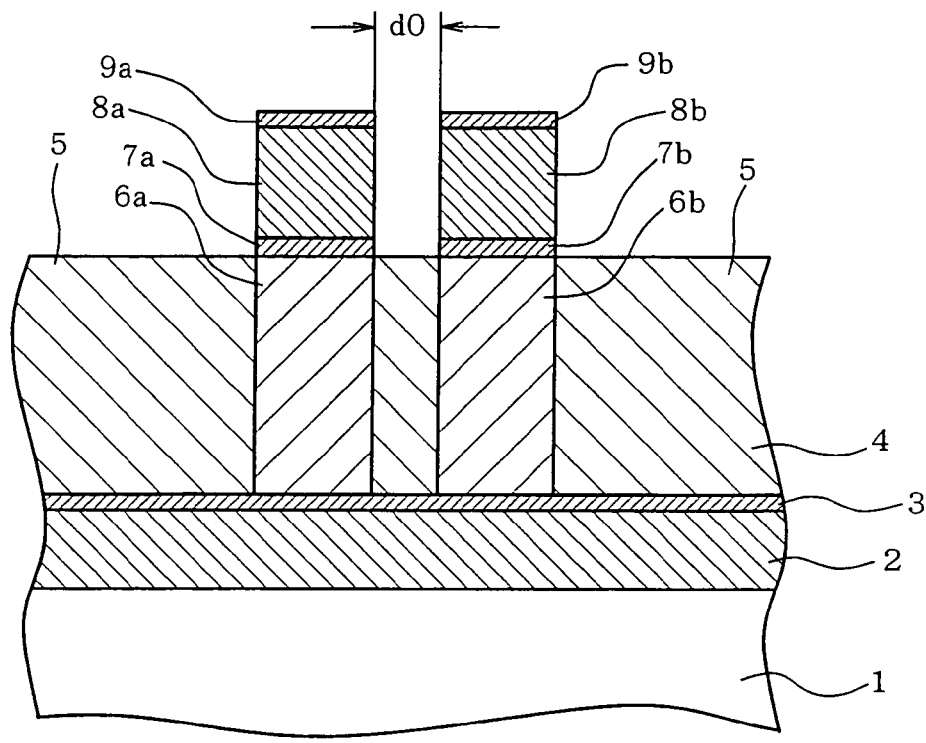
FIGS. 10A and 10B are views similar to FIGS. 1A and 1B, showing the conventional construction respectively.
Figure 10B:
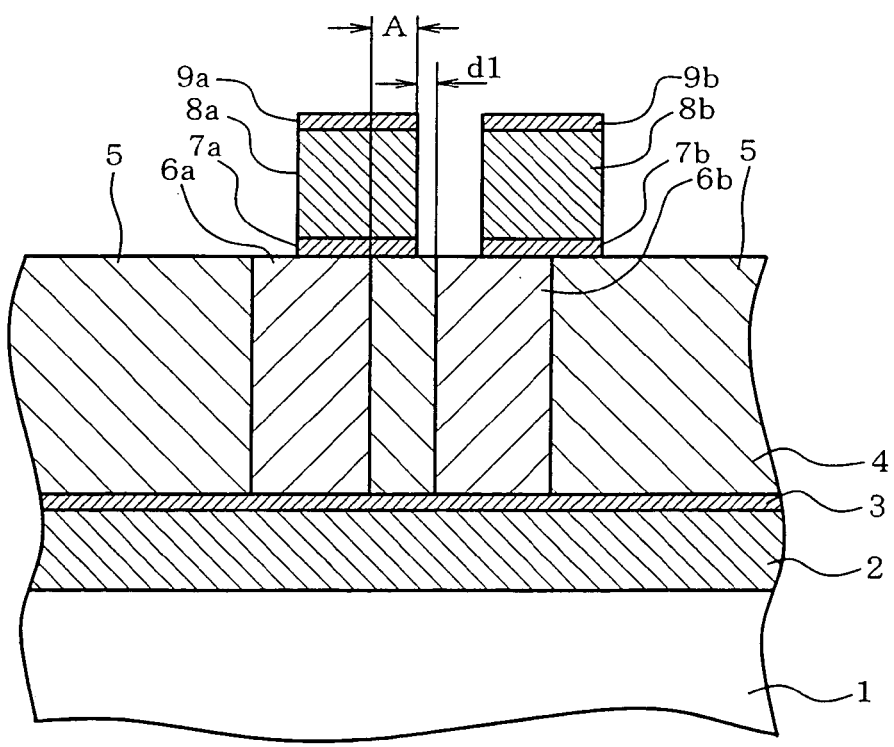
Figure 11A:
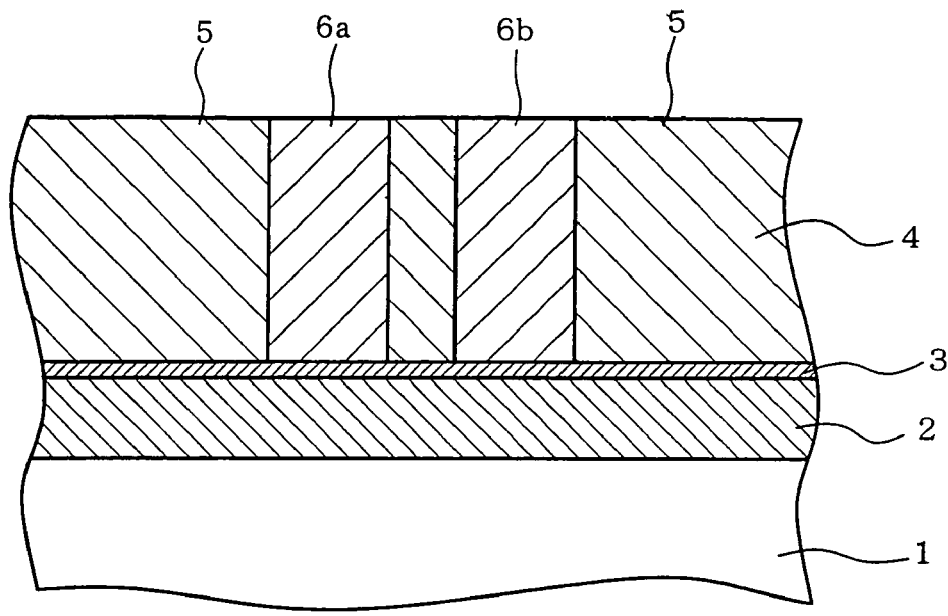
FIGS. 11A and 11B are views similar to FIGS. 9A to 9C, showing the conventional construction.
Figure 11B:
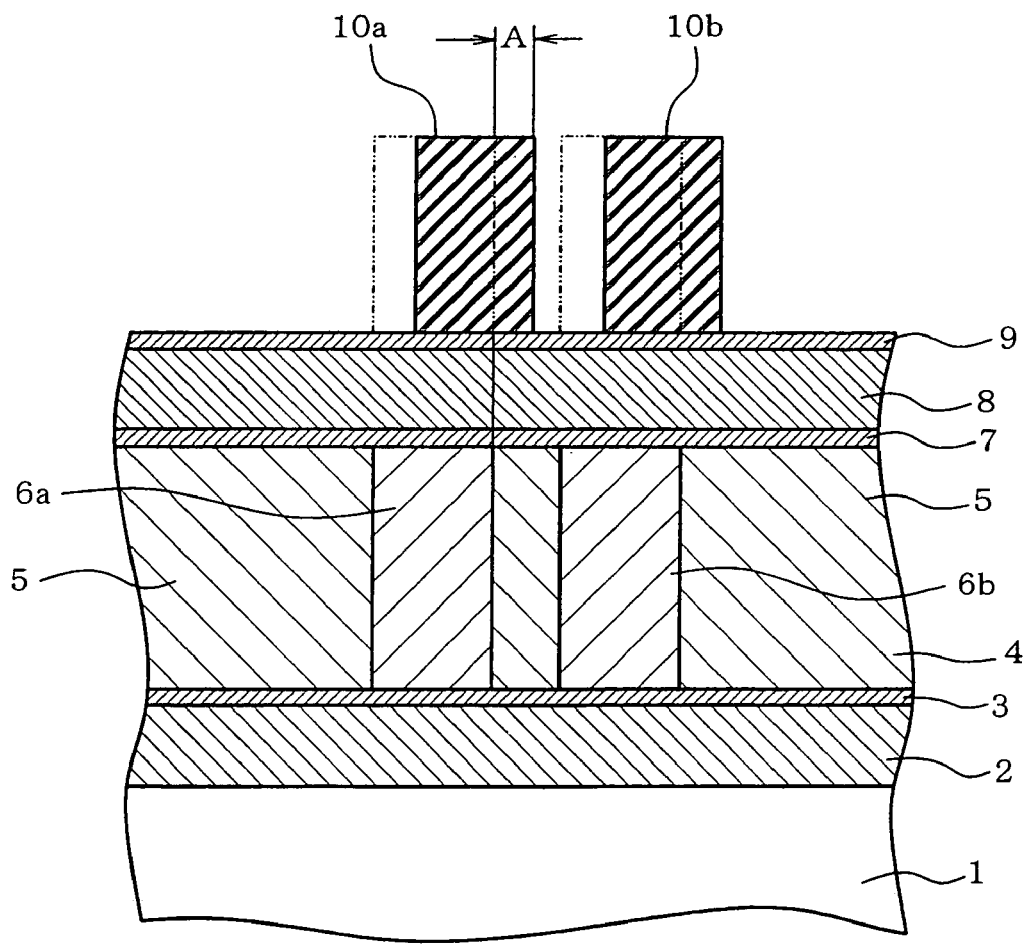

FIGS. 4A to 5C illustrate a second embodiment of the invention. Only the difference of the second embodiment from the first one will be described. FIGS. 4A and 4B show one layer of the multilayer wiring structure. FIG. 4A shows the case where no misalignment has occurred. The construction as shown in FIG. 4A is apparently the same as the prior art as shown in FIG. 10A. An interlayer wiring layer 22 employed instead of the interlayer 14 is formed so that a film thickness thereof becomes smaller by the recess amount f as the result of formation of the recessed portion P.

Figure 4B:
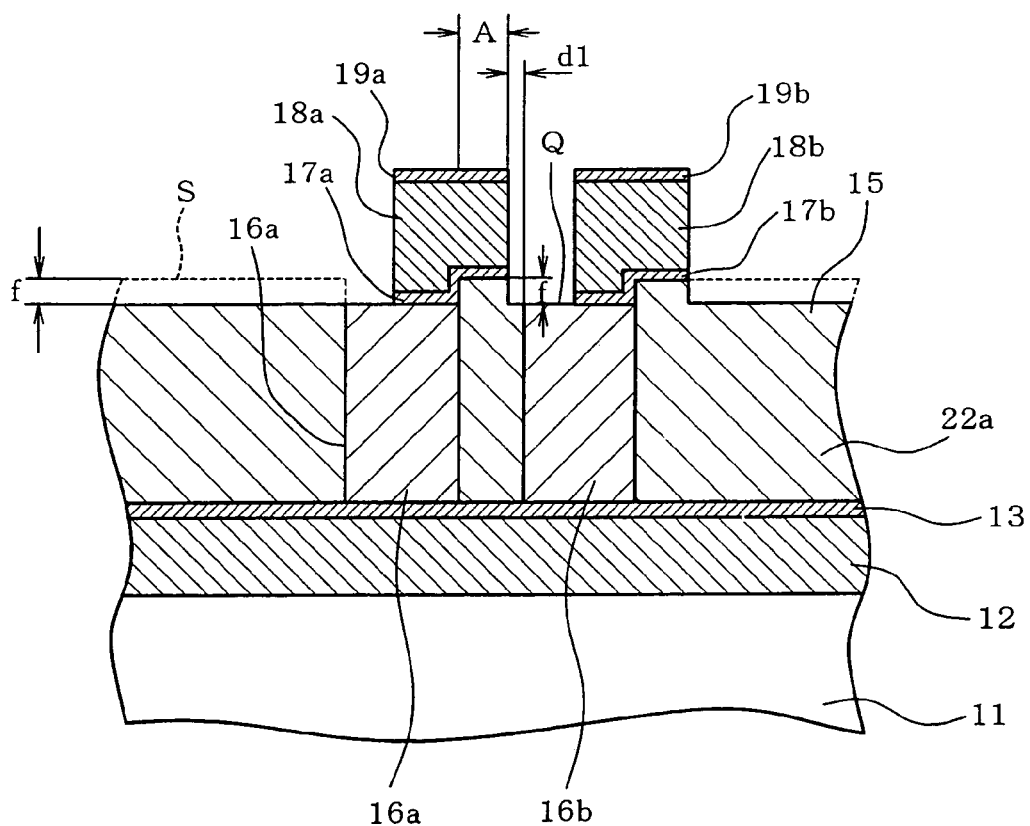

Further, when misalignment has occurred as shown in FIG. 4B, lower layer portions of the TiN films 19a and 19b, Al—Cu films 18a and 18b and TiN films 17a and 17b are located on the d-TEOS films 15 and raised so as to be formed into steps.

Thus, even when misalignment has occurred, the interlayer wiring layer 22a can be formed while the insulation distance is ensured as in the first embodiment. Consequently, an electrically stable semiconductor device can be realized with a sufficient processing time. Further, the number of added processes can be reduced and the number of steps of the lithography process can be prevented from being increased.

Figure 5A:
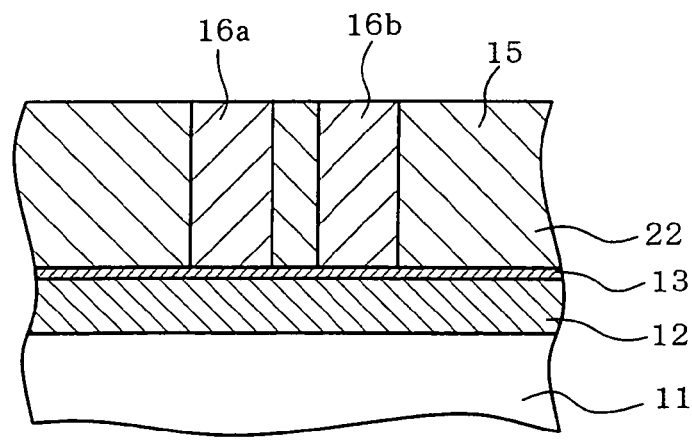
FIGS. 5A to 5C are views similar to FIGS. 2A and 2B, showing the longitudinal section of the semiconductor device.
Figure 5B:
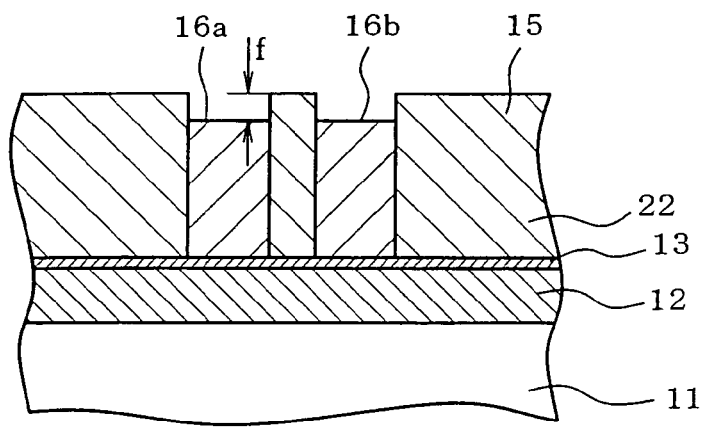
Figure 5C:
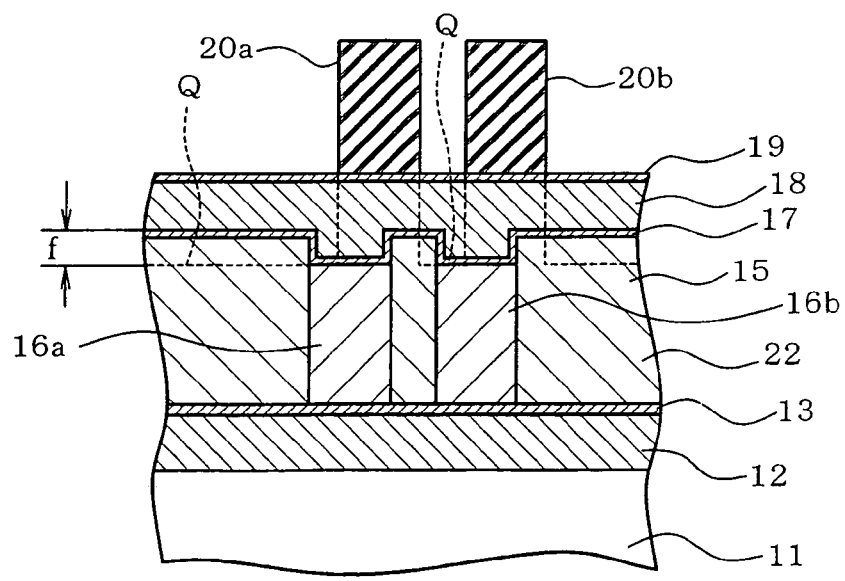

The process of fabricating the above semiconductor device will now be described with reference to FIGS. 5A to 5C. FIG. 5A shows the condition where the interlayer wiring layer 22 has been formed in the same manner as in the first embodiment. Subsequently, as shown in FIG. 5B, an etch back process is carried out for the W plugs 16a and 16b by RIE process. FIG. 5B shows the semiconductor device etched by gas plasma comprising $NF_3/O_2$ (the flow rate is set as 30/50 sccm, for example) so that the W plugs 16a and 16b are located lower than a surface layer of the d-TEOS film 15. Reference symbol f designates a recess amount by which the W plugs 16a and 16b have been recessed by the etch back process. In the shown case, f is set to 20 nm.

Subsequently, in the above-described state, a TiN film 17 serving as a barrier metal is formed on the W plugs 16a and 16b recessed by the etch back process and the d-TEOS film 15 serving as the interlayer insulating film. The Al—Cu film 18 serving as a material for the upper wiring layer is formed on the TiN film 17. The TiN film 19 serving as the barrier metal material is then formed on the Al—Cu film 18. The resists 20a and 20b corresponding to a wiring circuit are patterned on the TiN film 19 by the lithography process as shown in FIG. 5C. Each resist has a width of 150 nm, for example.

When no misalignment due to the patterning has occurred, the construction as shown in FIG. 4A is obtained through the etching process. Further, FIG. 4B shows the construction obtained when misalignment has occurred. An amount of misalignment due to the lithography process is shown as the misalignment amount A, which is 50 nm, for example.

Subsequently, the etching process is carried out in the same manner as in the first embodiment such that the construction as shown in FIG. 4A or 4B is obtained. Consequently, the same effect can be achieved from the second embodiment as from the first embodiment.

Figure 6A:
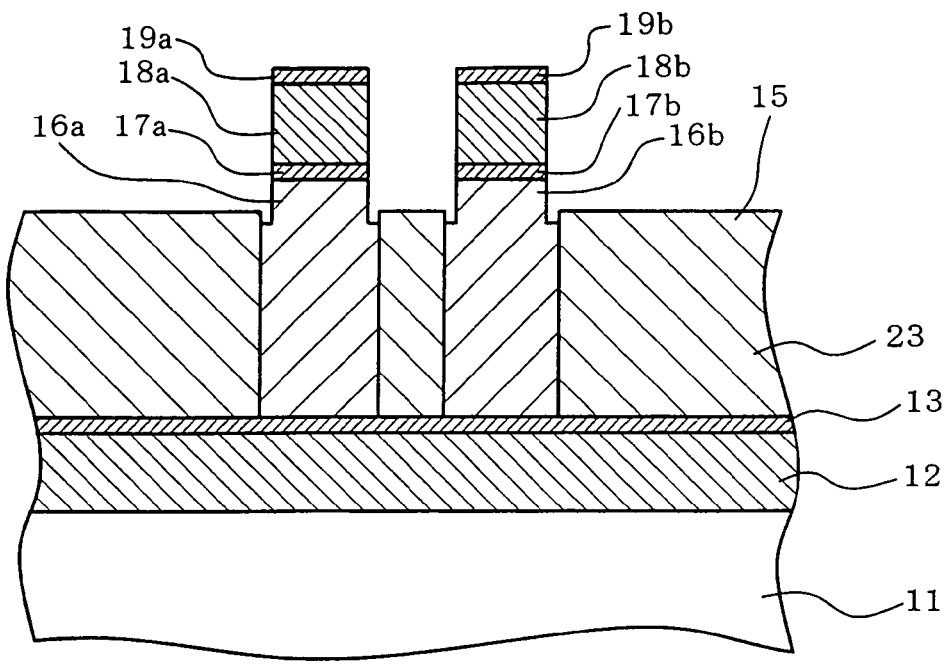
FIGS. 6A and 6B are view similar to FIGS. 1A and 1B, showing the semiconductor device in accordance with a third embodiment, respectively.

FIGS. 6A to 9C illustrate a third embodiment of the invention. The following describes only the difference of the third embodiment from the first embodiment. FIGS. 6A and 6B show one layer of the multilayer wiring structure. FIG. 6A shows the case where no misalignment has occurred in the patterning, whereas FIG. 6B shows the case where misalignment has occurred.

The construction as shown in FIG. 6A is substantially the same as in the first embodiment as shown in FIG. 1A. Describing the difference, the TiN films 17a and 17b, Al—Cu films 18a and 18b and TiN films 19a and 19b serving as the upper wiring layer have the respective widths smaller than the W plugs 16a and 16b.

In this construction, an interlayer wiring layer 23 differs from the interlayer wiring layer 14 employed in the first embodiment. Further, since etching conditions for tungsten plugs 16a and 16b in the third embodiment differ from those in the first embodiment, the depth of the recess exceeds the d-TEOS film 15 and a slight stepped portion is formed, as will be described with reference to FIG. 6B later. Further, since corners of the d-TEOS film 15 are etched so as to be actually rounded, no narrow gap is formed although not shown.

Figure 6B:
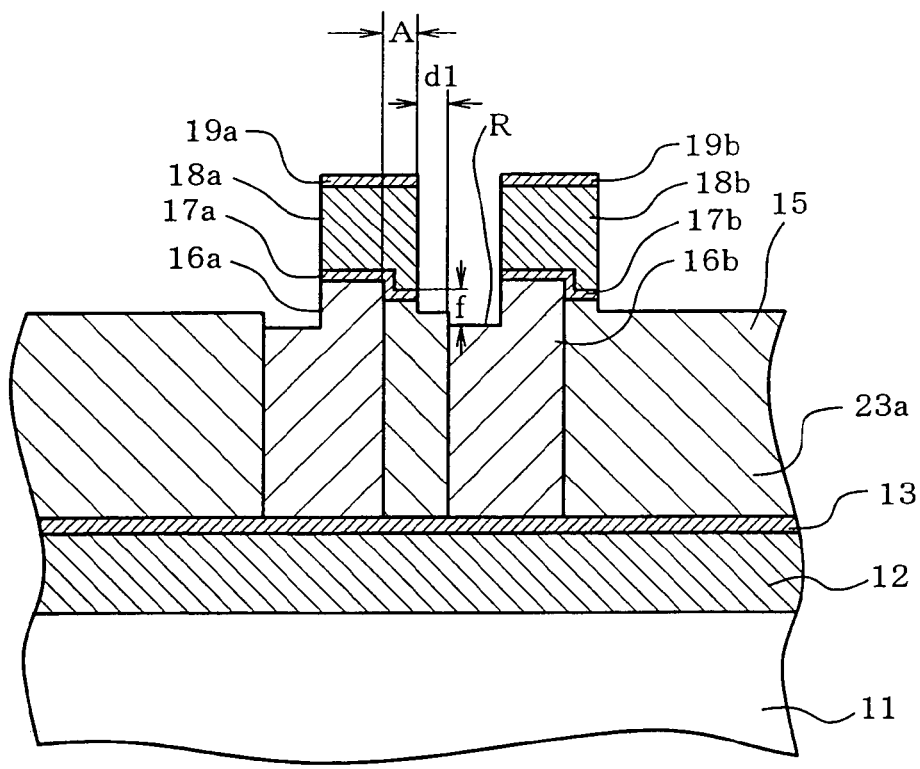

When misalignment due to the patterning has occurred as shown in FIG. 6B, a recessed portion R is formed between the portion of TiN film 17a, Al—Cu film 18a and TiN film 19a forming the left upper wiring layer and the W plug 16b serving as the right contact plug, whereupon a recess amount f is obtained between the left upper wiring layer and the right contact plug. As a result, an insulation distance can be ensured.

Figure 7A:
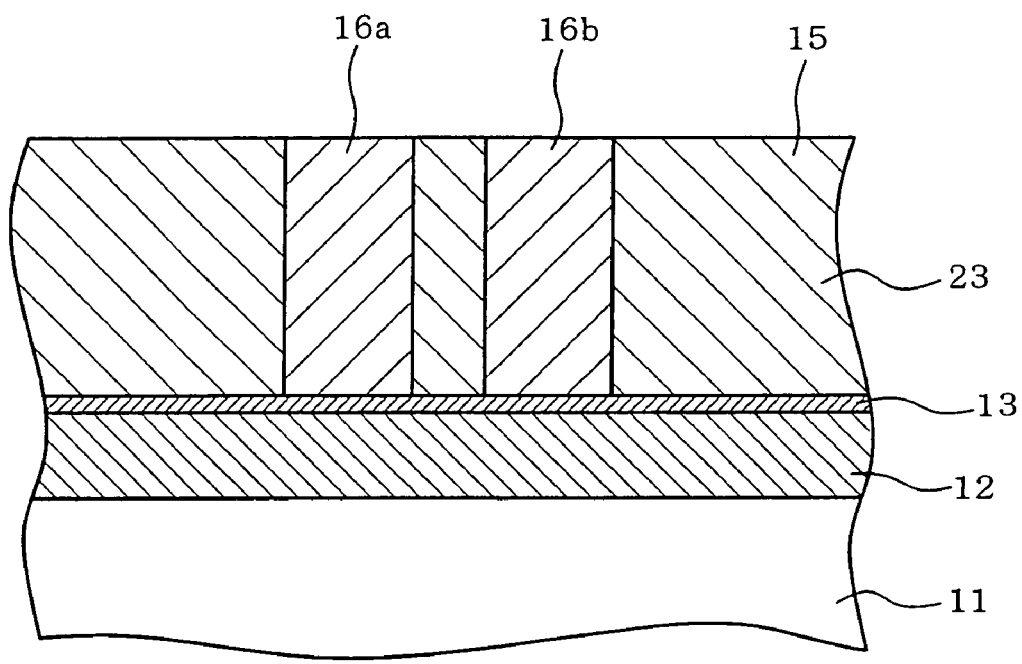
FIGS. 7A and 7B are views similar to FIGS. 2A and 2B, respectively.
Figure 7B:
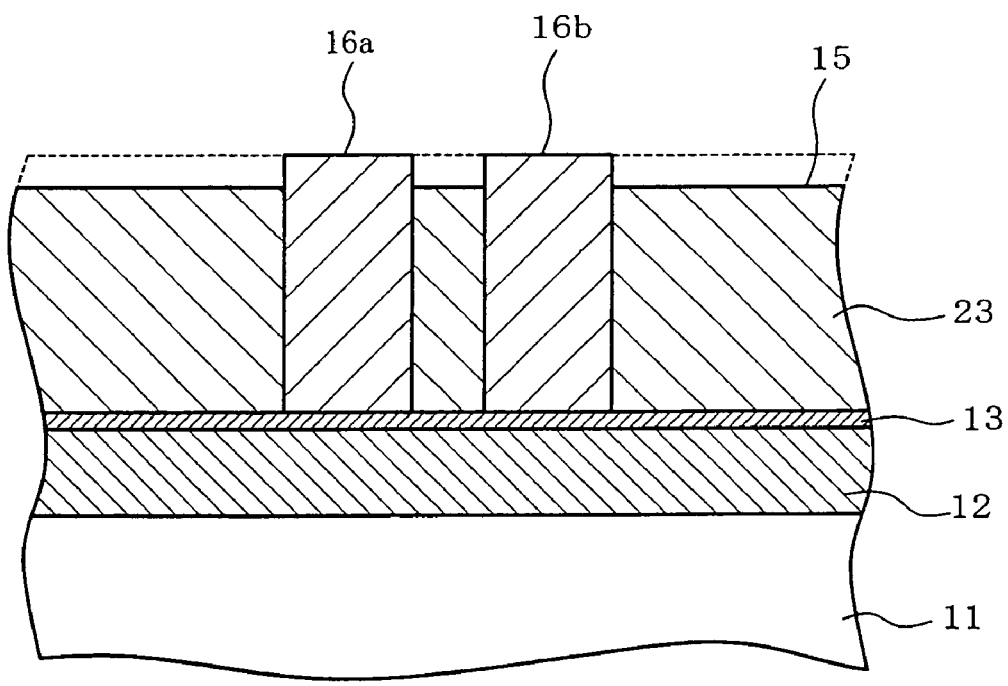

The process of fabricating the above semiconductor device will now be described. FIG. 7A shows the condition where the interlayer wiring layer 23 has been formed. The d-TEOS film 15 is then exposed to gas plasma comprising $CHF_3/Ar/O_2$ so that an etch back process is carried out by RIE method, whereby the W plugs 16a and 16b are formed so as to protrude relative to the d-TEOS film 15 as shown in FIG. 7B. The condition for the etch back process is shown as $CHF_3/Ar/O_2$=30/110/5 sccm and an etch-back amount is 20 nm.

Figure 8A:
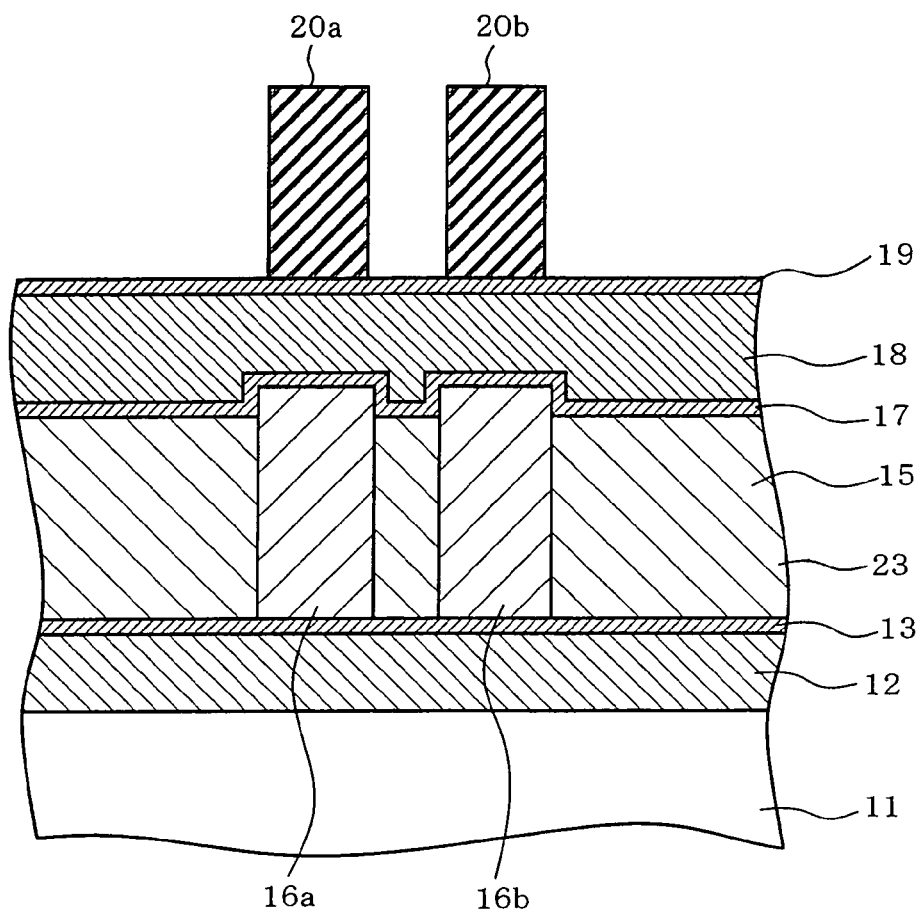
FIGS. 8A and 8B are also views similar to FIGS. 2A and 2B respectively.

The TiN film 17, Al—Cu film 18 and TiN film 19 serving as an upper layer side Al wiring are formed. The wiring pattern forming resists 20a and 20b are patterned on the TiN film 17, Al—Cu film 18 and TiN film 19 as shown in FIG. 8A. For example, each of the resists 20a and 20b has a pattern width of 100 nm, and a distance between the patterns of resists 20a and 20b is 100 nm. Each of the W plugs 16a and 16b has a pattern width of 150 nm, and a distance between the patterns of W plugs 16a and 16b is 80 nm. Thus, the upper wiring layer is set so as to have a smaller width. A purpose of this setting is to increase the margin in the patterning.

Figure 8B:
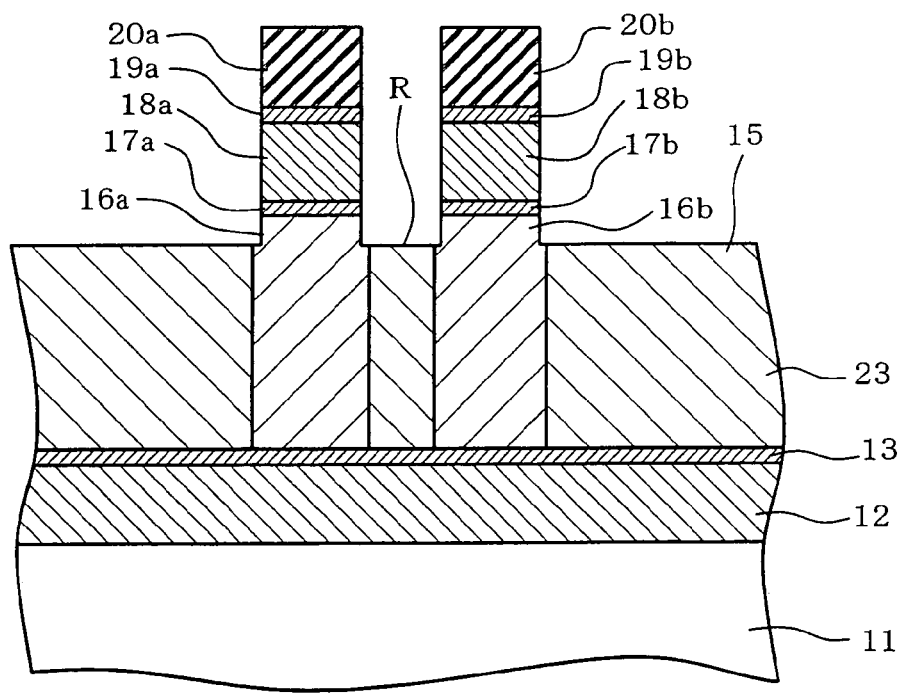

The TiN film 19, Al—Cu film 18 and TiN film 17 are etched and the d-TEOS film 15 is continuously etched so as to be recessed as shown in FIG. 8B. Subsequently, an ashing process is carried out for the resists 20a and 20b so that the construction as shown in FIG. 6A is obtained.

Figure 9A:
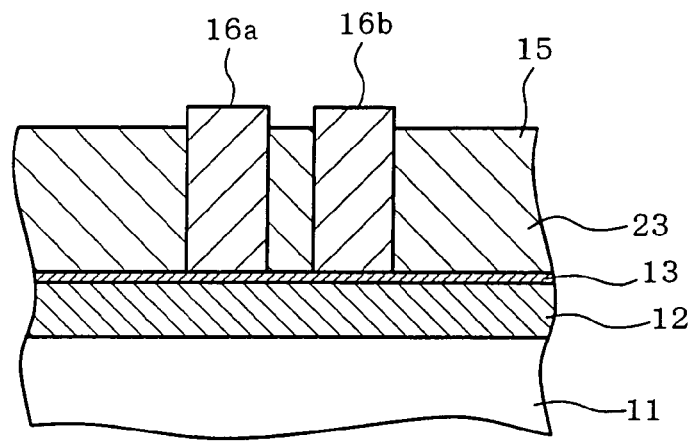
FIGS. 9A to 9C are typical longitudinal sections of the semiconductor device at different stages of the fabrication process in the case where misalignment has occurred.
Figure 9B:
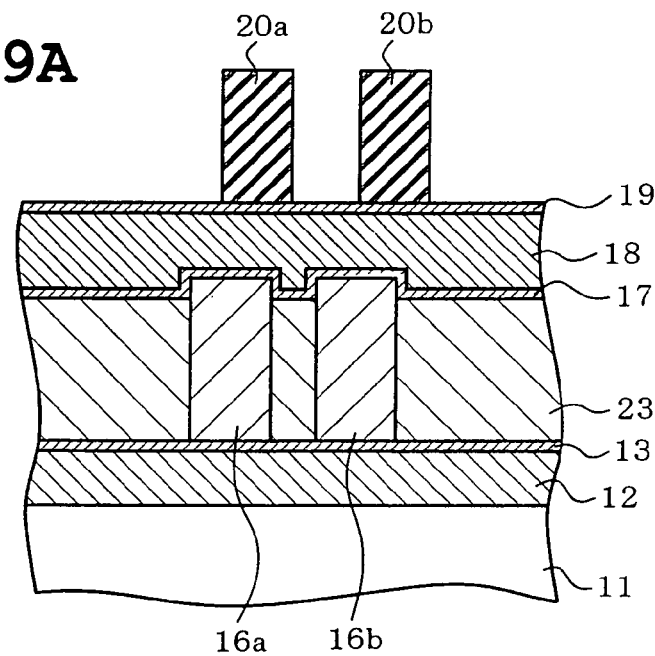
Figure 9C:
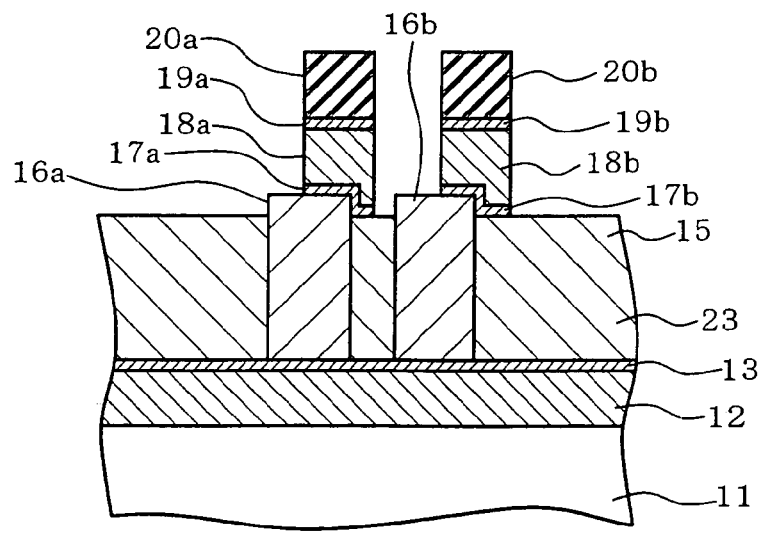

Further, when misalignment has occurred in the process of patterning the upper wiring layer, the resists 20a and 20b are patterned through the state as shown in FIG. 9A into the state as shown in FIG. 9B. When the etching process is carried out in the aforesaid state, the W plugs 16a and 16b are exposed as shown in FIG. 9C. Subsequently, when the etching process is carried out on the condition that the plugs 16a and 16b and d-TEOS film 15 are etched, a shape as shown in FIG. 6B is obtained.

Consequently, substantially the same effect can be achieved from the third embodiment as from the first embodiment. Further, the margin in the patterning can be increased by reducing the width of the upper wiring layer. Still further, electrical contact with the W plugs 16a and 16b can be made on the side of the stepped portion upon occurrence of misalignment when the upper wiring layer is patterned. Consequently, an increase in the contact resistance can be reduced such that the wiring structure with a desired electrical characteristic can be obtained.

The invention should not be limited to the foregoing embodiments. Several modified forms of the foregoing embodiments will be described. The recess amount f is set to 20 nm in the foregoing embodiments. However, the recess amount f may take any value on the condition that the distance between insulators required for the operation of the device can be ensured. Consequently, occurrence of short circuit and parasitic capacitance can be reduced.

Further, the recess amount f may be set to a suitable value according to the misalignment amount A. When the misalignment amount A is small, the recess amount f is also reduced, whereupon the burying performance of the interlayer insulating film in a subsequent process can be increased. On the other hand, when the misalignment amount A is large, the recess amount f is also increased, whereupon a desired insulation distance can be ensured.

In the foregoing embodiments, the different types of gas plasmas are used between the etching of the TiN film 17, Al—Cu film 18 and TiN film 19 serving as the upper wiring layer and the recessing of the W plugs 16a and 16b. However, any gaseous condition may be employed if the W plugs 16a and 16b are located under the underside of the TiN film 17 serving as the barrier metal. Further, these two etching processes are successively executed in the same etching chamber. However, the etching processes may be separately executed on condition that the W plugs 16a and 16b are located under the underside of the TiN film 17 serving as the barrier metal.

In the foregoing embodiments, the d-TEOS film 15 constituting the interlayer wiring layer and the W plugs 16a and 16b are etched at respective selection ratios equal to each other (selection ratio=1). However, if the insulation distance is met with respect to the upper layer wiring material and the contact plug material, the similar effect is achieved from the etching characteristics of the upper layer wiring material and the contact plug material whatever values the selection ratios may take. For example, the process may have a condition that the W plugs 16a and 16b are etched deep or the d-TEOS film 15 is etched deep.

In the foregoing embodiments, tungsten, TiN and Al—Cu alloy are used as the contact plug material, barrier metal and wiring material respectively. However, the similar effect can be achieved irrespective of the types of the contact plug material and wiring material on condition that the contact plugs are recessed to a desired depth. Further, the same type film may be used.

Recessing the tungsten plugs 16a and 16b serving as contact plugs may be carried out by a chemical dry etching (CDE) or wet etching, instead of RIE in the foregoing embodiments.

The interlayer insulating film 15 comprises the d-TEOS film in the foregoing embodiments. However, the interlayer insulating film 15 may comprise a high density plasma (HDP)-TEOS film, low pressure (LP)-TEOS film, plasma (P) —SiH$_4$ film, boro-phospho-silicate-glass (BPSG) film, phosphor-silicate-glass (PSG) film, plasma (P) —SiN film or low pressure (LP) —SiN film.

Tungsten is employed as the contact plug material in the foregoing embodiments. However, Al, Al—Cu alloy, Al—Si—Cu alloy, TiN, Ti, doped poly-Si, Cu or WSi may be employed as the material, instead of tungsten. Similarly, although Al—Cu is employed as the materials for the lower and upper wiring layers in the foregoing embodiments, W, Al, Al—Si—Cu, TiN, Ti, doped-poly-Si, Cu or WSi may be employed, instead.

The interlayer insulating film and the contact plug material are etched vertically in the foregoing embodiment. However, if there is no problem in the operation of the semiconductor device, the same effect can be achieved whatever shape the recessed portion may take, for example, tapered, inverted tapered, isotropic shape.

In the foregoing embodiments, the d-TEOS film 15 of the interlayer insulating film and the W plugs 16a and 16b of the contact plug material are recessed together. However, the d-TEOS film may previously be formed so as to be thicker by the recess amount f. Consequently, a desired device operation can be obtained without losing the function of an insulating film.

An etching mask is used in the process of resists 20a and 20b in the foregoing embodiments. A hard mask material may be employed for the etching mask if a desired shape is obtained.

The recessing process is applied to the contact plugs formed in the respective via holes in the foregoing embodiments. However, the recessing process may be applied to a device circuit using embedded wiring formed with an interlayer insulating film, instead. In this case, too, the same effect can be achieved.

In the second embodiment, the etch back process for the W plugs 16a and 16b can be employed if an etching rate of the d-TEOS film 15 serving as the interlayer insulating film is lower than an etching rate of the W plugs 16a and 16b. As a result, even when the d-TEOS film 15 has been etched, an etching amount at the W plug side can be rendered larger, the same effect can be achieved.

In the third embodiment, portions of the W plugs 16a and 16b exposed outside the upper wiring layer are removed without removal of the resists 20a and 20b after formation of the Al—Cu film 18 and TiN film 17. However, even when the similar plasma process is carried out after removal of the resists 20a and 20b, the similar shape can be obtained such that the same effect can be achieved.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

We claim:

1. A method of fabricating a semiconductor device, comprising:
    forming a lower wiring layer on a semiconductor substrate;
    forming an interlayer insulating film on the lower wiring layer;
    forming a plurality of contact plugs in the interlayer insulating film so that the contact plugs are brought into electrical contact with the lower wiring layer, thereby forming an interlayer wiring layer;
    forming an upper wiring layer on the interlayer wiring layer so that the upper wiring layer is brought into electrical contact with the contact plugs; and
    patterning the upper wiring layer so that the upper wiring layer corresponds to the contact plugs,
    wherein in the patterning, after the upper wiring layer has been etched, an exposed interlayer insulating film and exposed contact plugs are etched.

2. A method of fabricating a semiconductor device, comprising:
    forming a lower wiring layer on a semiconductor substrate;
    forming an interlayer insulating film on the lower wiring layer;
    forming a plurality of contact plugs within the interlayer insulating film so that the contact plugs are brought into electrical contact with the lower wiring layer, thereby forming an interlayer wiring layer;
    etching the contact plugs of the interlayer wiring layer so that each contact plug reaches a predetermined depth;
    forming an upper wiring layer on the interlayer wiring layer so that the upper wiring layer is brought into electrical contact with the contact plugs; and
    patterning the upper wiring layer so that the upper wiring layer corresponds to the contact plugs,
    wherein in the patterning, after the upper wiring layer has been etched, at least the exposed contact plugs of the interlayer wiring layer are etched.

* * * * *